United States Patent [19]

Jacksier

[11] Patent Number: 4,567,604
[45] Date of Patent: Jan. 28, 1986

[54] BIPHASE SIGNAL RECEIVER

[75] Inventor: Barry H. Jacksier, Wheeling, Ill.

[73] Assignee: AT&T Teletype Corporation, Skokie, Ill.

[21] Appl. No.: 526,940

[22] Filed: Aug. 29, 1983

[51] Int. Cl.$^4$ .............................................. H04L 27/22
[52] U.S. Cl. ........................................ 375/87; 329/104
[58] Field of Search ................. 360/42; 375/82, 83, 375/87, 94, 96, 110, 55; 329/104, 107; 328/138

[56] References Cited

U.S. PATENT DOCUMENTS

| | | | |
|---|---|---|---|
| 3,859,631 | 1/1975 | Holmes et al. | 375/87 X |
| 3,938,082 | 2/1976 | Schowe | 375/87 |
| 3,949,394 | 4/1976 | Kennedy | 360/42 |
| 3,994,014 | 11/1976 | Burgiss | 360/42 |
| 4,302,845 | 11/1981 | McClaughry et al. | 375/83 X |
| 4,313,206 | 1/1982 | Woodward | 375/110 |
| 4,449,119 | 5/1984 | Hanna et al. | 375/87 X |

Primary Examiner—Benedict V. Safourek
Attorney, Agent, or Firm—W. K. Serp; A. A. Tirva

[57] ABSTRACT

A receiver for a biphase-L signal A is described which includes a line-up detector 14 generating a circuit initialization pulse. A preamble detector 40 is responsive to a preamble of the incoming biphase-L signal A. A sampling signal generator 17 is responsive to the signal from the preamble detector 40, to the biphase signal A and to a second control signal. The output C of a time delay line 34 supplies the second control signal, and the input to the delay line 34 is supplied by the sampling signal generator 17. The output data signal H is generated by a flip-flop 54 which samples the biphase-L signal A at times determined by the output G of the sampling signal generator 17.

5 Claims, 2 Drawing Figures

BIPHASE SIGNAL RECEIVER

TECHNICAL FIELD

This invention relates to a biphase signal receiver.

BACKGROUND ART

A biphase signal may be conceptualized as including a series of cells each having clock and data information. One type of biphase signal is the biphase-L signal which has a mid-cell voltage level transition providing both clock and data information. The direction of the level transition corresponds to the data information stored in the cell. For example, a positive going transition represents a mark (high level data signal); and a negative going transition represents a space (low level data signal). Additionally, a level transition may be present at a cell boundary. Such a situation occurs whenever adjacent cells encode the same data information. Another scheme for biphase signal encoding is biphase-M. In this encoding scheme, a level transition occurs at each cell boundary; and either a positive or negative going mid-cell level transition occurs when the cell data is a mark.

Various circuits have been suggested for decoding biphase signals. One such circuit is described in U.S. Pat. No. 3,859,631 issued Jan. 7, 1975 to Holmes et. al. and entitled "Method And Apparatus For Decoding Binary Digital Signals". This reference discloses a voltage controlled oscillator synchronized to and running at a higher frequency than the clock frequency of a biphase signal. The oscillator controls a counter which is used in conjunction with logic circuitry to decode the data information. The voltage controlled oscillator operates at a frequency several times the frequency of the incoming biphase signal. Thus, the circuitry must be capable of high frequency operation.

DISCLOSURE OF THE INVENTION

In accordance with this invention, a receiver is provided for generating coded digital output signals in a first code in response to coded messages in a self-clocking message code different from the first code. Each message comprises a distinct preamble and message data. An input terminal is connected to a message code source. A second generating means is connected to the input terminal and generates a second control signal on a output conductor in response to the preamble. Means for generating a sampling signal is connected to the output conductor and the input terminal. The sampling signal is generated in response to the second control signal, a first control signal and the coded message. Means are connected to the sampling conductor for generating the first control signal in response to the sampling signal, and means are connected to the input terminal and to the sampling conductor for generating the output signals in the first code.

DRAWINGS

DETAILED DESCRIPTION

Figure 1:
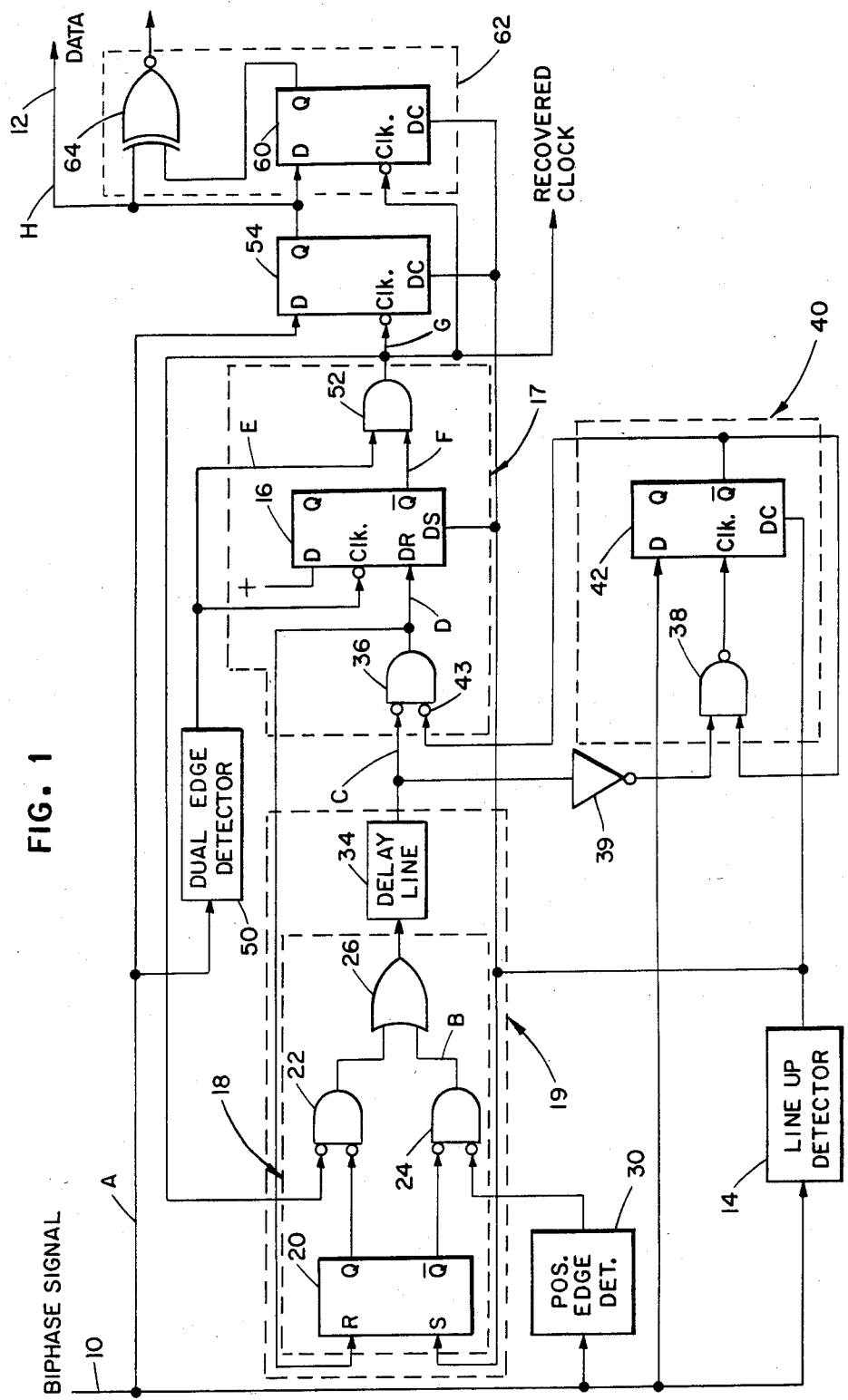
FIG. 1 is a circuit diagram of a biphase signal receiver.
Figure 2:
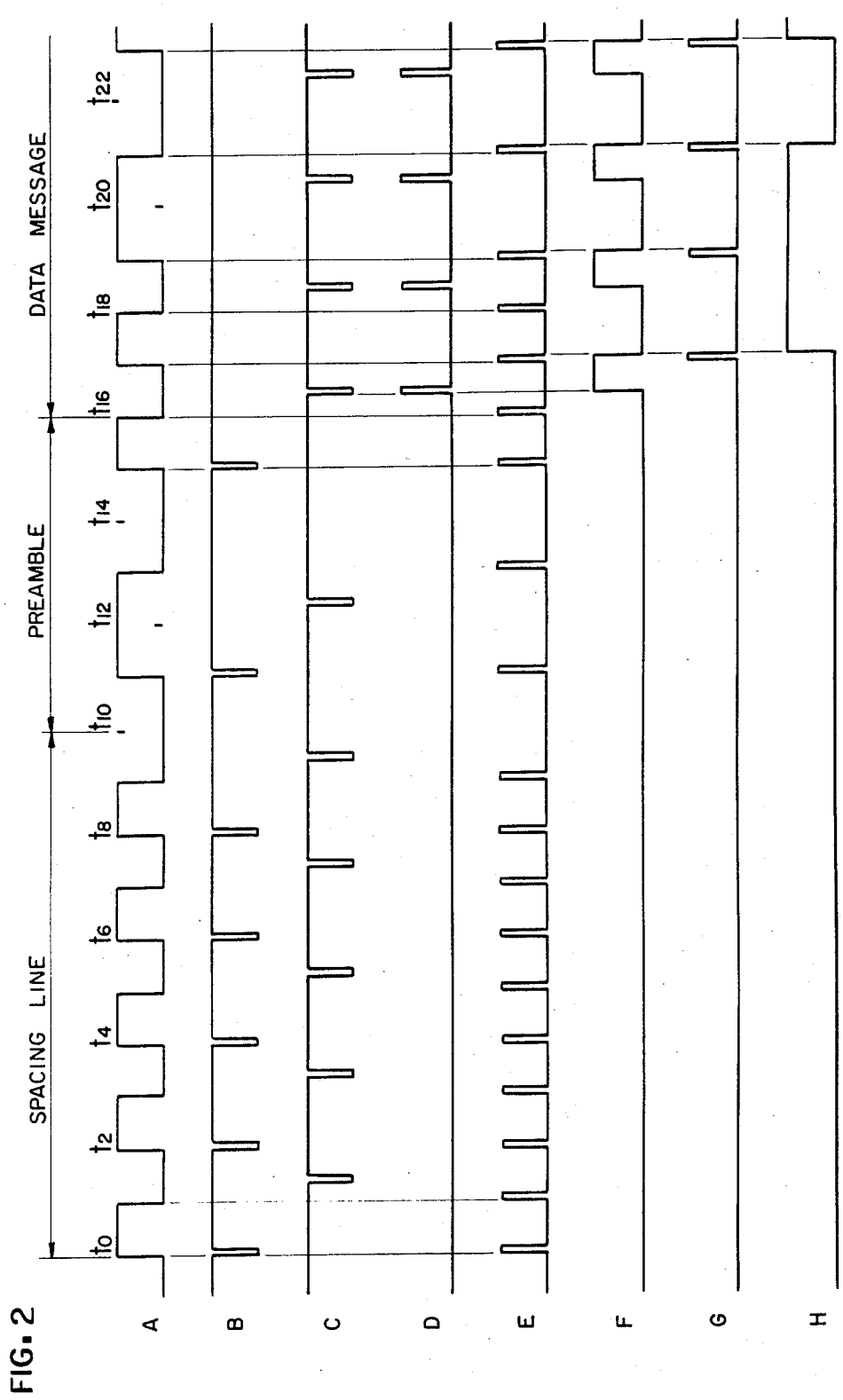
FIG. 2 is a timing diagram of selected signal levels of the circuit of FIG. 1.

The biphase receiver illustrated in FIG. 1 accepts, at an input terminal 10, a biphase-L signal A (FIG. 2) having a preamble from t10 to t16 followed by a data message. At an output terminal 12, the receiver provides a mark-space signal H corresponding to the data message of the incoming biphase-L signal A. As illustrated in FIG. 2, centered on each cell (each cell delimiting successive even numbered times) of the incoming biphase-L signal A, is a signal level transition. For example, the cell between t0 and t2 has a negative going transition; and the cell between t10 and t12 has a positive going transition. A positive going transition represents a mark, and a negative going transition a space. It will be appreciated that the voltage level, during the last half of a cell, for example from time t11 to t12, corresponds to the data encoded in the cell. That is, when a cell represents a mark, the voltage level during the last half of the cell is high. In the event two adjacent cells encode the same data information i.e. both a mark, there will be a level transition at the cell boundaries as at times t2, t4, t6 and t8. As will be subsequently described, the illustrated receiver decodes the data message of the biphase-L signal by sampling the cell voltage level immediately after the mid-cell transitior and providing this voltage level to external circuitry (not shown) for one clock period. In response to the initial presence of the biphase-L signal A at the input terminal 10, a line-up detector 14 generates a line detect pulse which initializes the receiver circuitry. The line-up detector 14 sends this pulse to the direct set input of a type-D flip-flop 16 of a data sampling signal generator 17. The flip-flop 16 will remain in the set condition with Q high until a preamble sequence of cells of the biphase-L signal A has been recognized. The line detect signal also initializes a switch 18 forming part of a first control signal generating means 19. The switch 18 includes an R-S flip-flop 20, a pair of AND-gates 22, 24 and a two-input OR-gate 26. The flip-flop 20 controls the AND-gates 22, 24 so that either the signal from the sample signal generator 17 or the output of a positive edge detector 30 will appear at the output of the OR-gate 26. The two inputs of the OR-gate 26 are fed by the output of the AND-gates 22, 24. The input of the positive edge detector 30 receives the incoming biphase-L signal A from the terminal 10 and generates a positive pulse train B in response to each positive going level transition of the biphase-L signal A.

The output of the OR-gate 26 is fed to the input of a delay line 34 which provides a time delay interval equal to three-quarters of the time period of the clock of the biphase-L signal A. The output of the delay line 34 designated signal C is a series of negative going pulses as illustrated in FIG. 2. The output of the delay line 34 is fed to an active low input of a dual input AND-gate 36 and to one input of a dual input NAND-gate 38 through an inverter 39. The NAND-gate 38 comprises a component of a preamble decoder 40. The output of the NAND-gate 38 is fed to the clock input of a type-D flip-flop 42 which transfers the signal at the D input to the direct output Q in response to a rising edge of the signal at the clock input. The compliment output of the flip-flop 42 is fed to the remaining input of the NAND-gate 38. The flip-flop 42 toggles enabling the sample signal generator 17 by placing a low level on the active low AND-gate 36 input 43. The compliment output of the flip-flop 42 will remain low until the next line detect pulse clears the flip-flop 42 disabling the AND-gate 36 and enabling the NAND-gate 38.

The preamble sequence of the biphase-L signal A illustrated in FIG. 2 is a mark-space-mark (1-0-1) sequence from time t10 through t16. Slightly after time t12 negative going pulse C appears at the clock input of flip-flop 42. At this time, the D input to the flip-flop is high thus bringing the compliment output of the flip-flop 42 low. During prior occurrences of the negative going pulse C, the D input to the flip-flop 42 was low. The next pulse C from the delay line 34 occurs after time t16 and is generated by the biphase-L signal A transition at t15 passing through the delay line 34. The pulse passes through the AND-gate 36 resetting the flip-flop 20. The flip-flop 20 disables the AND-gate 24 and enables the AND-gate 22. The sampling signal generator 17 also includes the type-D flip-flop 16 which is reset by the output of the AND-gate 36 and clocked by the output E of a dual edge detector 50. The dual edge detector 50 generates a positive going pulse E, at the direct output, in response to each level transition of the biphase-L signal A.

The compliment output of the flip-flop 16 is fed to one input of a dual input AND-gate 52, and the alternate input of the AND-gate 52 is fed with the signal E from the direct output of the dual edge detector 50. Thus, the output of the AND-gate 52 follows the output of the dual edge detector 50 when the signal F is high. This interval starts with the reset of the flip-flop 16 by the output of the delay line 34 and ends in response to the next level transition of the biphase-L signal A. The output pulse G from and AND-gate 52 clocks a type-D flip-flop 54. Each time the sampling flip-flop 54 is clocked, the voltage level of the biphase-L signal A appearing at the D input is transfered on the falling edge of the clock signal to the direct output Q producing signal H. As previously mentioned, the voltage level of the cell immediately following the mid-cell transition corresponds to the level data information encoded in that cell; and thus, the signal H provides a mark-space signal corresponding to the data encoded in the biphase-L signal A. It will be appreciated that the output G of the AND-gate 52 is a recovered clock signal having a frequency equal to that of the incoming biphase-L signal A.

A feature of the illustrated receiver is that the circuitry may be modified to receive incoming biphase-M as well as biphase-L signals. The additional components necessary to decode a biphase-M signal are illustrated within the dotted area indicated by the numeral 62. The biphase-M decoding circuitry 62 include a type-D flip-flop 60. The D input of the flip-flop 60 is fed by the direct output of the first flip-flop 54. The direct outputs Q of both of the flip-flops 54 and 60 are fed to separate inputs of a dual input, exclusive NOR-gate 64. The output of the NOR-gate 64 is a mark-space data signal. When used to decode a biphase-M signal, the initial line signal is a series of marking cells having positive boundary transitions followed by a premable of three spacing cells. The data information is valid after the second recovered clock pulse.

In summary, a biphase-L signal A appears at the input terminal 10 and line-up detector 14 responds by generating a line detect pulse which initializes selected components of the receiver. The positive going transitions of the incoming biphase-L signal A generate pulses which pass through the delay line 34 clocking the preamble flip-flop 42. The biphase-L signal A is fed to the D input of the flip-flop 42. In response to the fist occurrence of a mark-space-mark sequence, the signal from the delay line 34 generates a pulse slightly after time t12 latching a low level at the compliment output of the flip-flop 42.

The pulse train passing through the AND-gate 36 occurs three-quarters of a time period after the last mid-cell transition i.e. during the first quarter time interval of the next cell of the biphase-L signal A. The AND-gate 52 is enabled and remains in the enabled condition until the next mid-cell transition. Cell boundary transition pulses from the dual edge detector 50 will not pass through the AND-gate 52 since the AND-gate 52 opens after the first quarter of the following cell and is closed by the mid-cell level transition E from the dual edge detector 50. The pulse E generated by the dual edge detector 50, in response to this mid-cell transition, clocks a high level from the D input of the flip-flop 16 to the direct output thereof. The compliment output of the flip-flop 16 goes low thus blinding the AND-gate 52. The pulse G at the output of the AND-gate 52 also clocks the flip-flop 54, and the biphase-L signal A level following the mid-cell level transition is transfered to the direct output of the flip-flop 54.

Although this invention has been described in relation to a preferred embodiment thereof, it will be appreciated that various changes and modifications may be made without departing from the scope and spirit of the invention.

I claim:

1. A receiver for generating digital output signals in response to received messages encoded in a biphase signal coding format, each message comprising a spacing portion, a preamble portion and a data portion, the receiver comprising:
   an input terminal (10) for accepting an incoming message,
   a first detection means (19) responsive to said incoming message signal for generating a first control signal,
   a second detection means (40) responsive to said first control signal and said preamble portion of said incoming message signal for generating a second control signal,
   means (17) connected to said input terminal and first (10) and second (40) detection means for generating a third control signal in response to said first and second control signals and for generating a sampling signal in response to said first and second control signals and voltage level transitions of said message signal,
   said first detection means (19) including a switch (18) responsive to said third control signal for switching the generation of said first control signal from response to said incoming message signal to response of said sampling signal, and
   means connected to said input terminal (10) and said sampling means (17) for generating digital output signals in response to said sampling signal and said message signal.

2. The receiver of claim 1 herein said first detection means (19) includes a delay device (34) for providing a time delay for said first control signal.

3. The receiver of claim 2 herein said second detection means (40) is responsive to said incoming message signal and said first and second control signals.

4. The receiver of claim 3 herein said second detection means (40) is responsive to a preamble portion of said message signal comprised of two consecutive cells at different voltage levels.

5. The receiver of claim 4 which further includes a line-up detector (14) responsive to said incoming message signal for generating an initializing signal for said first (19) and second (20) detection means, said sampling signal generating means (17) and said output means (54).

* * * * *